AKIHIRO OHKUMA,

INVENTOR

BY Wenderoth, Lind & Ponack
ATTORNEYS

AKIHIRO OHKUMA,
*INVENTOR*

BY Wenderoth, Lind & Ponack
*ATTORNEYS*

METHOD FOR COATING ELECTRONIC COMPONENTS

Filed Nov. 16, 1971 3 Sheets-Sheet 3

AKIHIRO OHKUMA
INVENTOR

BY Wenderoth, Lind & Ponack
ATTORNEYS

United States Patent Office 3,804,737
Patented Apr. 16, 1974

3,804,737
METHOD FOR COATING ELECTRONIC COMPONENTS

Akihiro Ohkuma, Osaka, Japan, assignor to Matsushita Electric Industrial Co., Ltd., Kadoma, Osaka, Japan Filed Nov. 16, 1971, Ser. No. 199,210
Int. Cl. B01k 5/02
U.S. Cl. 204—181 12 Claims

ABSTRACT OF THE DISCLOSURE

A method for coating an electronic component having at least one lead wire attached thereto. The electronic component is immersed in an insulating liquid having fine particles of resin dispersed therein so that a part of the lead wire extends above the surface of the insulating liquid. A high electric potential is imposed across the lead wire and an electrode inserted at a bottom position of the insulating liquid for a given time period, whereby the fine particles of resin move toward the electronic component electrophoretically and cover the surface of the electronic component. The resin particle covered electronic component is withdrawn from the insulating liquid, and the insulating liquid remaining on the surface of the resin particle covered electronic component is evaporated. The fine particles of resin are cured to form a resin coating on both the surface of the electronic component and the part of the lead wire which was immersed.

BACKGROUND OF THE INVENTION AND PRIOR ART

The present invention relates to a method for coating electronic components and more particularly to a coating method based on electrophoretic movement of fine particles of resin under a high electric potential.

There have been known various methods of coating electronic components with a resin coating. Practically, the most popular method is one in which a vehicle including coating resin material is applied to an electronic component by spraying or dipping, and the thus applied coating is cured after being dried. Another method is one in which a powdered coating resin is adhered to a heated electronic component and is cured. The coating applied according to the conventional methods has an irregular thickness from portion to portion over each body coated and has a rather small thickness. In addition, it is difficult in the conventional methods to prevent contamination of a portion of the lead wire to be soldered to an electric circuit of the component.

OBJECTS AND BRIEF DESCRIPTION OF THE INVENTION

It is an object of this invention to provide a method for coating electronic components with a thick coating of resin having uniform thickness.

Another object of this invention is to provide a method for coating electronic components with a coating of resin having no pin-holes and no bubbles therein.

A further object of this invention is to provide a method for coating electronic components having lead wires attached thereto in which the said lead wires are not contaminated by the coating material.

These objects are achieved by a method for coating an electronic component having a lead wire attached thereto according to the present invention, which method comprises inserting said electronic component in a bath of an insulating liquid having fine particles of resin dispersed therein so that a part of said lead wire extends above the surface of said insulating liquid, imposing a high electric potential across said lead wire and an electrode, for example a positive electrode, inserted at a bottom portion of said bath of insulating liquid for a given time period, whereby said fine particles of resin move toward said electronic component electrophoretically and cover the surface of said electronic component, withdrawing the resin particle covered electronic component from said bath of insulating liquid, evaporating the insulating liquid remaining at the surface of the resin particle covered electronic component, and curing said fine particles of resin to form a resin coating on both the surface of said electronic component and a part of said lead wire. The insulating liquid should be a liquid which has an electric resistivity higher than 10 MΩ-cm., and which is inert to said fine particles of resin.

BRIEF DESCRIPTION OF THE FIGURES

These and other objects of this invention will be apparent from a consideration of the following detailed description taken together with the accompanying drawings, wherein.

Figure 1:
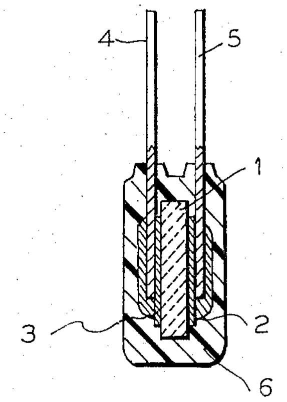
FIG. 1 is a cross-sectional view of an electronic component having a coating thereon formed according to the method of the present invention.

Before proceeding with the detailed description of the method for coating an electronic component contemplated by the present invention, an electronic component coated with resin by the novel method according to the present invention will be described with reference to FIG. 1. In this figure, reference character 1 designates an element of the component, for example, a zinc oxide sintered disc described in U.S. Pat. 3,598,763. Silver electrodes 2 and 3 are applied to both flat surfaces of said sintered disc 1. Two lead wires 4 and 5 are attached to said silver electrodes 2 and 3, respectively, by any suitable method, such as soldering. A resin coating 6, prepared by the method according to the present invention, covers the whole of said sintered disc 1 and said silver electrodes 2 and 3, and partly covers said two lead wires 4 and 5. Said resin coating 6 is characterized by a uniform thickness and a distinct boundary between the bare part of the lead wires and the coated part of the lead wires. This means that the bare parts of the lead wires are free from the resin material of the coating and can easily be soldered to an electric circuit.

Figure 2:
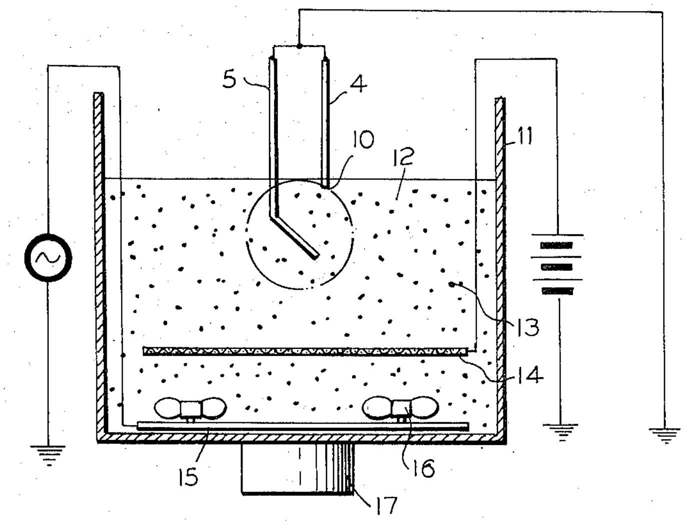
FIG. 2 is a schematic view of an apparatus containing a coating bath for carrying out the coating method according to the present invention.

Referring to FIG. 2, in the method according to the invention, the aforesaid electronic element 10 having lead wires 4 and 5 attached thereto is immersed in a bath 12 of insulating liquid having fine particles of resin 13 dispersed therein. The bath 12 is contained in a container 11 made of insulating material. The free ends of said lead wires 4 and 5 extend above the surface of said bath 12 of insulating liquid. The lead wires 4 and 5 of the electronic component 10 are grounded for safety. Said fine particles 13 of resin coat the whole of said electronic component element 10 and the parts of the lead wires 4 and 5 which are beneath the surface of said bath 12 of insulating liquid. The resin particle coated electronic component 10 also having the parts of the lead wires 4 and 5 coated with said fine particles 13 of resin is withdrawn from said bath 12 of insulating liquid while the high electric potential is maintained between the lead wires 4 and 5 and the positive electrode 14. After the coated electronic component is completely removed from the bath 12 of insulating liquid, the imposition of the high electric potential is discontinued. The insulating liquid adhering to the fine particles of resin on said electronic component 10 and the parts of the lead wires 4 and 5 is vaporized by any suitable and available method. Finally, said fine particles of resin on said electronic component 10 and the parts of the lead wires 4 and 5 is cured to form a resin coated electronic component as shown in FIG. 1.

It is preferable that said fine particles 13 of resin have a specific gravity close to that of said insulating liquid. The reason for this is that a big difference in the gravity causes the fine particles of resin to float on the top portion of said bath of insulating liquid or to precipitate to the bottom thereof. It is preferred that the difference between the specific gravities be within 10%. A better result is obtained if the difference is within 5%.

The dispersion of fine particles of resin can be improved by stirring said insulating liquid during the carrying out of the method by any suitable method. Reference character 16 in FIG. 2 designates such a stirring means which is shown as rotatable blades driven by conventional driving means (not shown). The electrophoretic movement of fine particles of resin is not affected badly by the stirring operation. A preferable method for stirring is by means of ultrasonic vibrations ranging from 1 kHz. to 60 kHz. When said insulating liquid is stirred by the stirring means 16 and ultrasonic vibrations are also applied thereto by an ultrasonic wave generator 17, as shown in FIG. 2, fine particles of resin are well dispersed in the insulating liquid so that the fine particles of resin are deposited evenly on the surfaces of the component and the lead wires immersed in the insulating liquid. In addition, the fine particles of resin deposited on the component and lead wires do not drop down. When said insulating liquid is stirred by a method such as ultrasonic vibration, it is preferable that the positive electrode 14 be in a grid form and that the stirring means be located beneath said positive electrode in grid form so as to stir the insulating liquid well through said positive electrode. A positive electrode in grid form also has better discharge characteristics.

Said positive electrode 14 is preferably coated with a layer of insulating material. When the electronic component 10 is withdrawn from the insulating liquid, a lead wire thereof may inadvertently touch the positive electrode 14 on which a high electric potential is still imposed. If this happens, the power source will be damaged or the operator may receive an electric shock. Providing a positive electrode coated with an insulating layer prevents such accidents, and further it prevents rusting of the metal of the positive electrode. The electrophoretic activity of the fine particles of resin is not badly affected by coating the positive electrode with an insulating layer.

The particle size distribution of fine particles of resin has an effect on the resultant coating and preferably ranges from 10 to 250 microns and has the highest probability at a particle size of 60 to 100 microns.

Any liquid having an electric resistance higher than 10 MΩ/cm. and which is inert to said fine particles of resin can be used as an insulating liquid. A preferred liquid is one member selected from the group consisting of trifluorotrichloroethane, gasoline and kerosene. When trifluorotrichloroethane, gasoline or kerosine is used as an insulating liquid, a preferred resin consists essentially of epoxy resin. However, the invention is not limited to such a combination.

Figure 3:
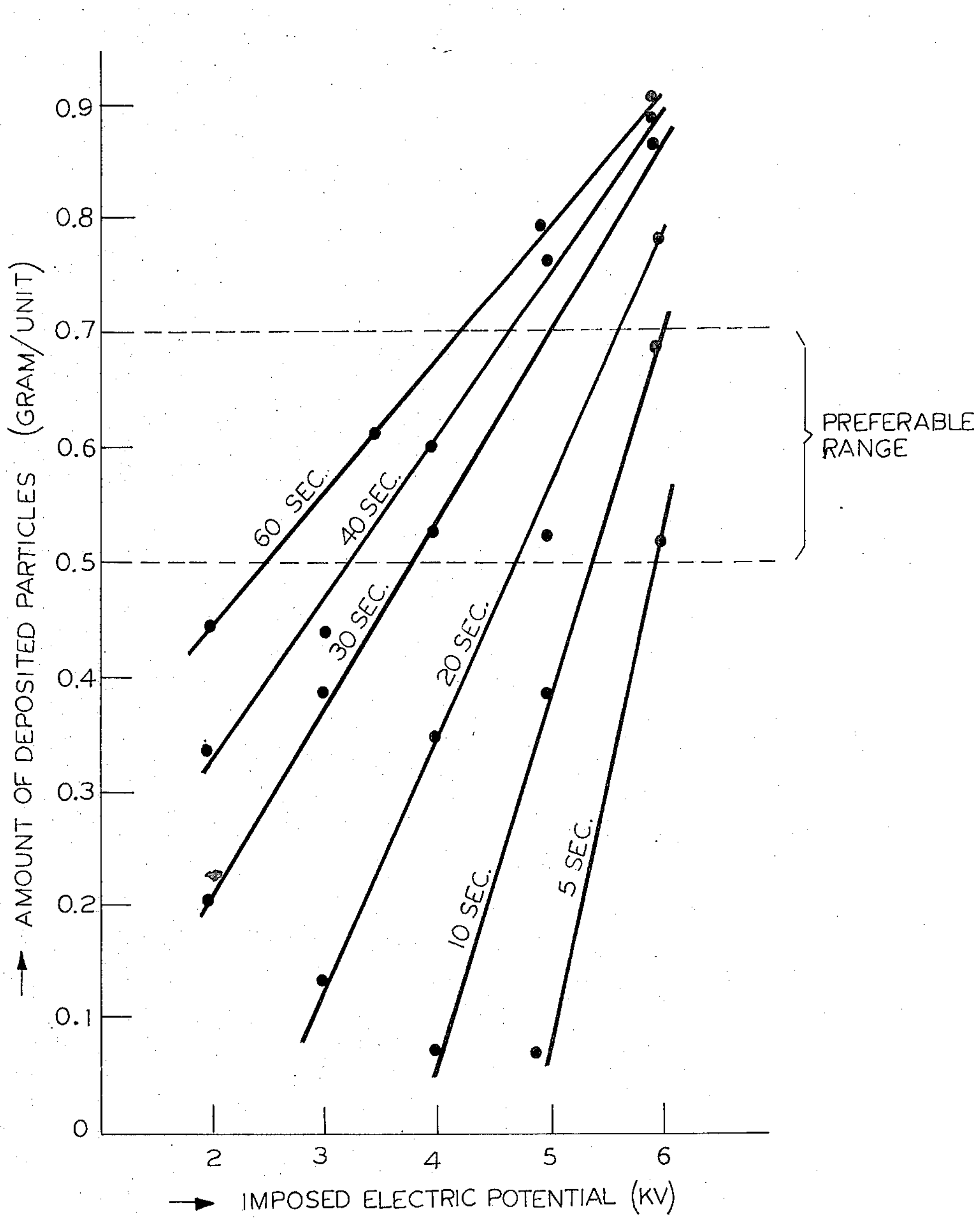
FIG. 3 is a graph showing the change in the amount of material deposited in the coating layer against the imposed electric potential in the method according to the present invention.

A value of said high electric potential depends upon the distance between said positive electrode and said electronic component, and is preferably 3 to 6 kv. when the distance is 2.0 to 3.0 cm. The time period during which said high electric potential is imposed ranges from 5 to 60 seconds. For example, when a zinc oxide sintered disc 14 mm. in diameter and 1 mm. in thickness is coated with fine particles of epoxy resin dispersed in trifluorotrichloroethane, the thickness of the coating increases with an increase of the imposed high electric potential as shown in FIG. 3. In FIG. 3 the change in thickness of the coating is shown as an increase of the amount of the deposited resin particles (grams) per one component, for various time periods during which the high electric potential is imposed. In the case of said zinc oxide sintered disc, a preferred thickness range of the coating is between the dotted lines shown in FIG. 3.

Figure 4:
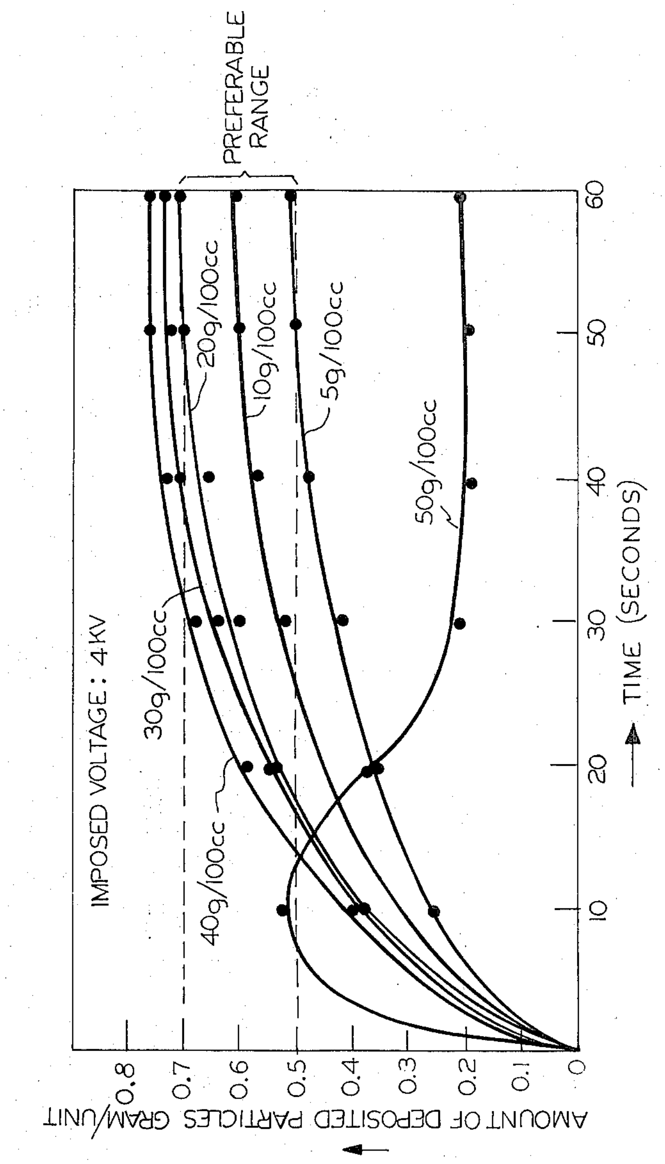
FIG. 4 is a graph showing the change in the amount of material deposited in the coating layer against the concentration of fine particles dispersed in an insulating liquid in the coating bath in the method according to the present invention.

FIG. 4 shows changes in the amounts of the deposited resin particles in grams per one component plotted against various time periods when an electric potential of 4 kv. is imposed across the positive electrode and the lead wire of the zinc oxide sintered disc which is similar to that used in FIG. 3, for various concentrations of fine particles of epoxy dispersed in trifluorotrichloroethane. The preferable range of the coating is also shown by dotted lines in FIG. 4. As is obvious from FIG. 4, preferred concentrations of resin particles range from 5 to 50 grams per 100 cc. of the insulating liquid.

A highly efficient operation can be achieved by making the fine particles of resin electrically neutral before said fine particles of resin reach the positive electrode and are provided with a positive electric charge therefrom. This is accomplished by imposing an A.C. voltage across the insulating liquid and ground. A preferred A.C. voltage ranges from 1000 to 3000 v. The A.C. voltage is applied by positioning another electrode beneath said positive electrode, i.e. the electrode 15 shown in FIG. 2. The fine particles of resin which are neutralized by the imposed A.C. voltage are uniformly provided with a positive electric charge at the positive electrode and are uniformly deposited on the surface of the electronic component and the parts of the lead wires thereof immersed in the insulating liquid. Accordingly, the coating layer is formed uniformly without pin-holes or bubbles therein.

It is further preferable that said insulating liquid include a charge control reagent to charge the fine particles uniformly, for example, positively. There are many kinds of charge control reagents available. For example, cobalt naphthenate charges fine particles of epoxy in trifluorotrichloroethane positively.

In the above described method, a high positive electric potential is imposed across the lead wire and the positive electrode immersed in an insulating liquid. However, it is also possible to impose a high negative electric potential across the lead wire and a negative electrode inserted in the insulating liquid.

It is to be understood that the above-described embodiments are merely illustrative of the principles of the invention. Various other embodiments may be readily devised by those skilled in the art which will embody these principles and fall within the spirit and scope thereof.

What is claimed is:

1. A method for coating an electronic component having at least one lead wire attached thereto, comprising:

immersing said electronic component in an insulating liquid of trifluorotrichloroethane having fine particles of resin dispersed therein so that a part of said lead wire extends above the surface of said insulating liquid;

imposing a high electric D.C. potential across said lead wire and a first electrode inserted at a bottom portion of said insulating liquid for a given time period, whereby said fine particles of resin move toward said electronic component electrophoretically and cover the surface of said electronic component;

Imposing on said insulating liquid having said fine particles of resin dispersed therein an A.C. voltage between ground and a second electrode positioned beneath said first electrode;

stirring said insulating liquid having said fine particles of resin dispersed therein;

withdrawing the resin particle covered electronic component from said insulating liquid;

evaporating the insulating liquid remaining on the surface of the resin particle covered electronic component; and curing said fine particles of resin to form a resin coating on both the surface of said electronic component and the part of said lead wire which was immersed.

2. A method for coating an electronic component as claimed in claim 1 further comprising subjecting said insulating liquid having said fine particles dispersed therein to an ultrasonic vibration at a frequency ranging from 1 kHz. to 60 kHz.

3. A method for coating an electronic component as claimed in claim 1 wherein said first electrode is in grid form.

4. A method for coating an electronic component as claimed in claim 3 wherein said first electrode is coated with an insulating layer.

5. A method for coating an electronic component as claimed in claim 1 wherein said AC voltage ranges from 1000 to 3000 v.

6. A method for coating an electronic component as claimed in claim 1 wherein said fine particles of resin have a particle size distribution which ranges from 10 microns to 250 microns.

7. A method for coating an electronic component as claimed in claim 6 wherein the concentration of said fine particles of resin in said insulating liquid ranges from 5 to 50 grams per 100 cc. of said insulating liquid.

8. A method for coating an electronic component as claimed in claim 7 wherein said high electric potential ranges from 3 to 6 kv.

9. A method for coating an electronic component as claimed in claim 8 wherein said high electric potential is imposed for a time period of 5 to 60 seconds.

10. The method for coating an electronic component claimed in claim 1 wherein said fine particles of resin have a specific gravity close to that of said insulating liquid.

11. A method for coating an electronic component as claimed in claim 10 wherein said fine particles of resin consist essentially of epoxy resin.

12. A method for coating an electronic component as claimed in claim 1 wherein said insulating liquid having said fine particles dispersed therein includes a charge control reagent to charge said fine particles positively before imposing said high electric potential.

References Cited

UNITED STATES PATENTS

| | | | |
|---|---|---|---|
| 2,898,279 | 8/1959 | Metcalfe et al. | 204—181 |
| 3,471,327 | 10/1969 | Gerland et al. | 204—181 |
| 3,509,036 | 4/1970 | Igras et al. | 204—181 |
| 3,547,788 | 12/1970 | Tanaka et al. | 204—181 |
| 3,645,873 | 2/1972 | Cornish et al. | 204—181 |

HOWARD S. WILLIAMS, Primary Examiner